United States Patent
Lee et al.

(10) Patent No.: US 7,208,342 B2
(45) Date of Patent: Apr. 24, 2007

(54) PACKAGE WARPAGE CONTROL

(75) Inventors: Michael Keat Lye Lee, Selangor (MY); Mun Leong Loke, Penang (MY); Soon Chuan Ong, Penang (MY); Hooi Jin Teng, Penang (MY); Lisa Yung Hui Lee, Sarawak (MY); Altaf Hasan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 211 days.

(21) Appl. No.: 10/856,371

(22) Filed: May 27, 2004

(65) Prior Publication Data

US 2005/0266607 A1    Dec. 1, 2005

(51) Int. Cl.
*H01L 21/50* (2006.01)
*H01L 21/48* (2006.01)
*H01L 21/44* (2006.01)
*H01L 23/12* (2006.01)
*H01L 23/40* (2006.01)

(52) U.S. Cl. ............... 438/106; 438/125; 257/704; 257/E23.086; 257/E23.083

(58) Field of Classification Search ............ 438/106, 438/125; 257/704, 706–707, 710, 718–719, 257/E23.083, E23.086
See application file for complete search history.

(56) References Cited

U.S. PATENT DOCUMENTS 6,413,353 B2 *   7/2002   Pompeo et al. .......... 156/307.3

* cited by examiner

*Primary Examiner*—Luan Thai
(74) *Attorney, Agent, or Firm*—Marger Johnson & McCollom, P.C.

(57) ABSTRACT

A method of packaging includes placing a restrainer on a package during processing. The method includes clipping the restrainer in place and then exposing the package to high temperatures. After processing the restrainer is removed. An alternative process attaches a component die to a substrate having a cavity in a first surface. The process may then include dispensing and curing an underfill material in the cavity, and attaching a lid to the first surface of the substrate.

7 Claims, 6 Drawing Sheets

PACKAGE WARPAGE CONTROL

BACKGROUND

Component die packages, such as those used in packaging semiconductor devices, have become larger and more complicated than those previously used. This has led to outgoing package warpage after the package assembly process. Package warp may create many problems for downstream users. For example, pin grid array (PGA) packages, warpage contributed to poor pin tip true position that may lead to pin rework. For land grid array (LGA) packages, the warpage may lead to high resistance or open contacts between the package and the socket. For ball grid array (BGA) packages, excessive warpage may lead to surface mount problems. In addition, BGA packages have JEDEC (Joint Electron Device Engineering Council) standards for warpage. With the larger and more complicated packages, these standards may be difficult to achieve.

In addition, current 90 nanometer (nm) wafer technologies may use low-k dielectric layers, such as porous cured dielectrics, in their build up layers. This requires that the package impose almost no stress on the die, as die stress can lead to cracks and bumps. These defects create multiple reliability issues for packages, including open failures, short failures, reliability stress failures and may result in component dysfunction failures.

In most cases, the package warpage is caused by the underfill epoxy cure process, generally performed at high temperatures. Current approaches may add a mechanical reinforcement to the package, increasing costs, or accepting the additional warpage, leading to wasted packages that do not meet the relevant standards. It is also possible to lower the cure temperature, but that largely depends upon the material properties and may compromise the quality and reliability of the components.

BRIEF DESCRIPTION OF THE DRAWINGS

The invention may be best understood by reading the disclosure with reference to the drawings, wherein.

DETAILED DESCRIPTION OF THE EMBODIMENTS

During the assembly of electronic component packages, the die containing the electronic components may be packaged between a package substrate and a lid. The package may go through multiple processes that involve elevated temperatures. Examples of such processes include chip attach reflow, deflux, epoxy underfill prebake and cure, integrated heat spreader (lid) cure, and ball attach reflow. The exposure to these levels of heat may affect the package by causing it to warp excessively.

Excessive warpage may be defined with regard to a relevant metric, such as the JEDEC coplanarity standard. Generally, coplanarity is a definition of how much a package is bent based upon assigned measurement points. The measurement points may differ depending upon the connections used between the package and the mounting surface, such as ball grid array or land mounting. The mounting surface is the surface to which the package is being connected, such as a printed circuit board. The current JEDEC standard is that the packages have a coplanarity of less than 8 mils.

Some approaches to dealing with excessive warpage include modifying assembly processes through temperature profile optimization to control warpage. Reducing the temperature of the various processes or slowing the cooling rate can help avoid cracks in low-k layers. Some devices are being manufactured with a low-k dielectric layer as the interlayer dielectric (ILD). These layers may be more delicate and crack more easily than previously used layers. Lengthening the cooling or heating processes lengthens the process required to package the devices, lowering the efficiency of the line, as well as possibly increasing defects due to partial cures occurring at the lowered temperatures.

Other approaches include adapting mechanical reinforcements to assist in holding the substrate planar, such as some current implementations of integrated heat spreader lids. Some manufacturers may just accept the loss caused by die cracks, high coplanarity, and highly tilted lids due to coplanarity. Others may just accept their inability to meet JEDEC standards for packaging, or may try to change the standards for an entire industry. Others may include high numbers of pin reworks in their processing specifications, but this increases costs.

Figure 1A:
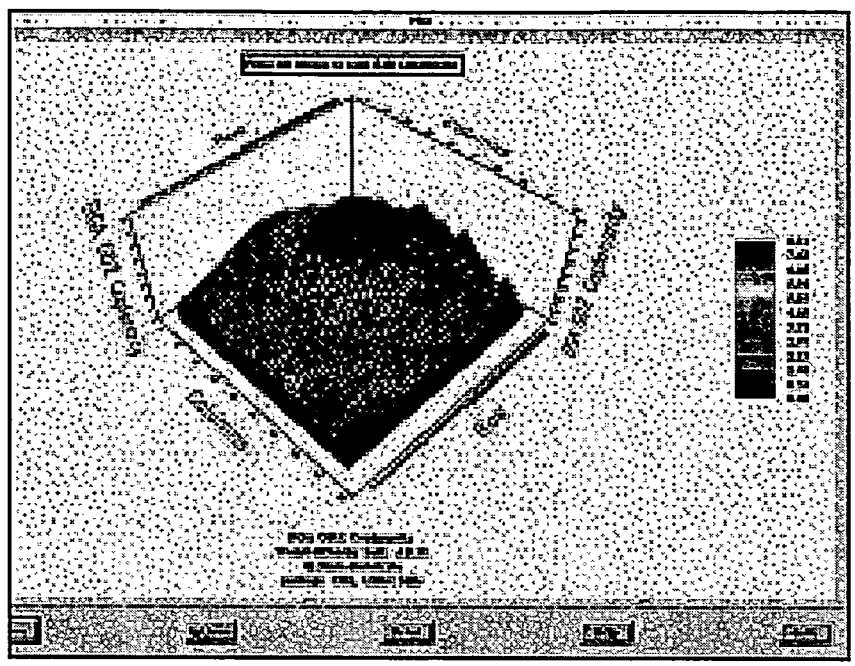
FIGS. 1a and 1b show a convex warpage profile for a package and a side view of a convexly warped package.
Figure 1B:
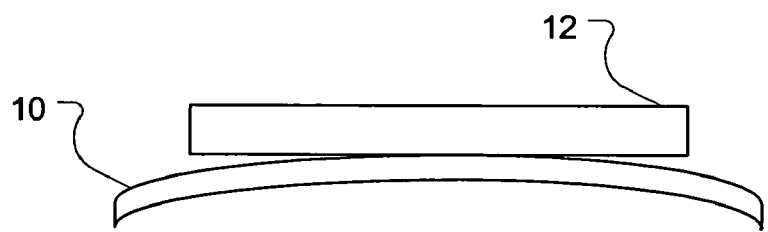

In some cases, the coplanarity increase may be in the range of 4–12 mils at the end of the assembly and test process. This may depend upon the combination of different die and package dimensions. Data indicates that the warpage induced in the package after chip, or die, attach is of a convex profile as shown in FIG. 1a. FIG. 1b shows a side view of a package substrate 10 and the component die 12, where the package has become convexly warped.

Figure 2A:
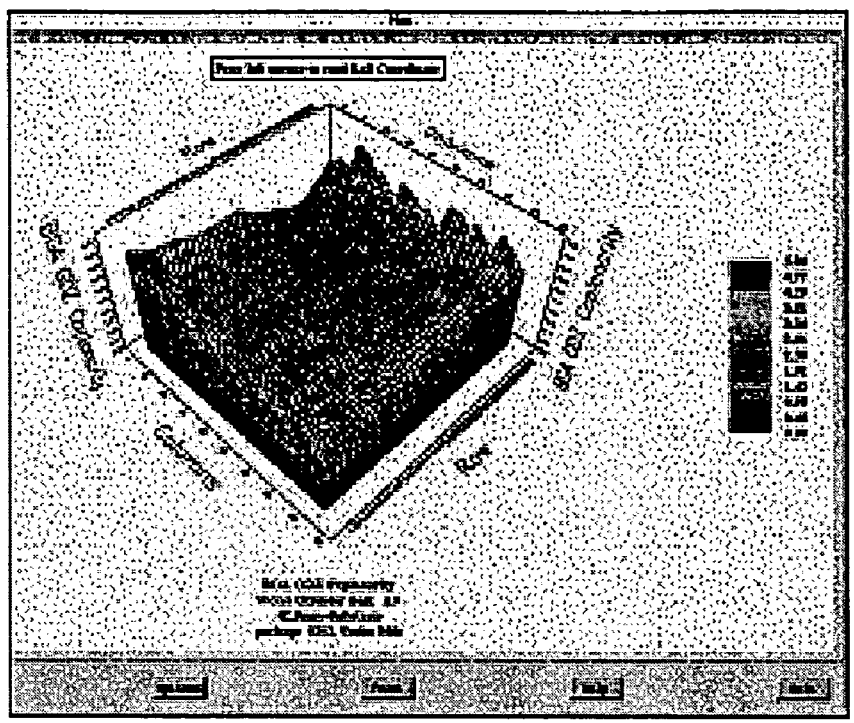
FIGS. 2a and 2b show a concave warpage profile for a package and a side view of a concavely warped package.
Figure 2B:
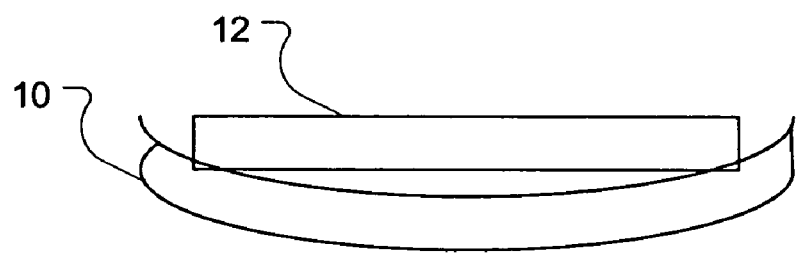

It is possible to pre-concavely warp the package during some of the high temperature processes such that the end result is a package having very little coplanarity. For example, FIG. 2a shows a concave profile of a warped package after an underfill epoxy cure process at high temperature. FIG. 2b shows the package substrate 10 and the component die 12 after the underfill epoxy cure, where the package has a concave warpage. It is possible to control the warpage profile at the earlier stages of the process such that the result meets the necessary coplanarity standards.

It is possible that the pre-concavity may result from any of the higher temperature process, to offset the induced convexity in later processes. The discussion below uses the process of the underfill epoxy cure, for ease of discussion only.

Figure 3:
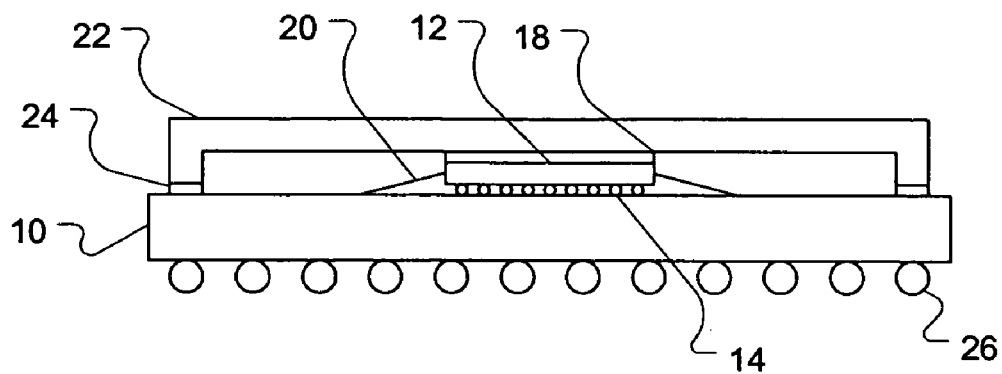
FIG. 3 shows an example of a component die package.

FIG. 3 shows an example of a component die in a package. The component die may be any type of active device that requires packaging for protection and use. For example, the component die may be an electronic component on a semiconductor substrate. The packaging protects the device and allows for use on printed circuit boards or other mounting surfaces through mounting connectors such as ball grid arrays, pin grid arrays, etc.

The die 12 is mounted to the packaging substrate 10 through die bumps 14. The packaging substrate may be several different types of substrates, such as ceramic, metal, semiconductor, etc. Die bumps 14 provide connection between the routing layers of the substrate 10 and the active components on the die. The use of die bumps is just an example of such a connector. The die may be packaged into a package comprised of the package substrate 10, the lid 22 and a sealant 24. The lid 22 in this example is an integrated heat spreader. A thermal interface material 18 may reside between the lid 22 and the die 10 to promote heat exchange. The underfill 20 assists in securing the die to the packaging substrate, as well as providing mechanical robustness to the connections. Package connectors, such as solder ball 26, may connect the package to a mounting surface, such as a printed circuit board (PCB). Again, the specific implementations of these various components are only intended as examples and for ease of discussion.

During the processing of these various parts of the package, the package is exposed to high temperatures, which promotes warpage. During most of these processes, the package substrate resides on a carrier that transports the substrate and the various components through the processes. It is possible to modify the carrier and adjust the processes to induce concavity into the package substrate.

Figure 4A:
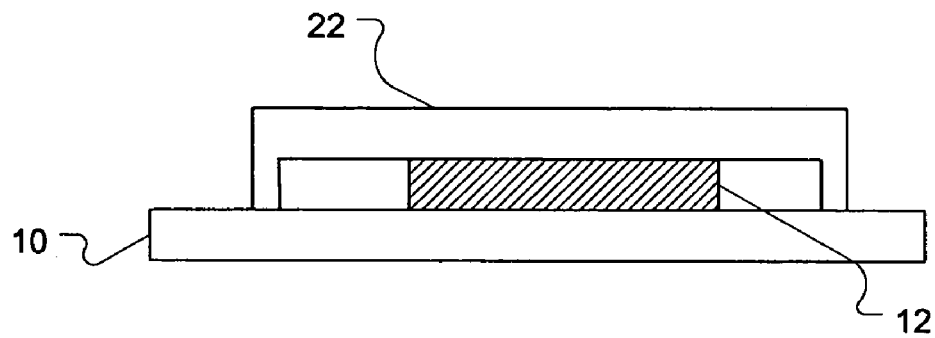
FIG. 4a shows an example of an integrated heat spreader lid.
Figure 4B:
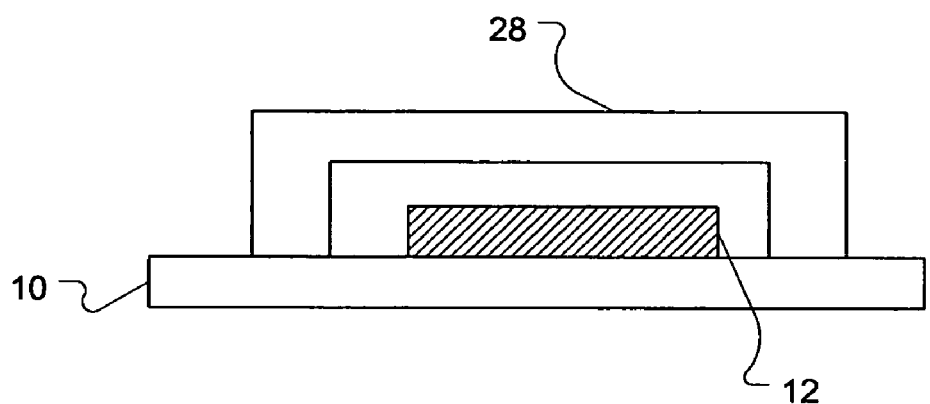
FIG. 4b shows an embodiment of a restrainer lid.

FIGS. 4a and 4b provide a comparison of the dimensions of a typical integrated heat spreader (IHS) lid and a restrainer lid to be used in embodiments of the invention. The heat spreader lid 22 has a narrow base area and the cavity is such that the lid may come into contact with the die, or the thermal interface material between the die and the lid. A restrainer, or restrainer lid, 28 may have a wider base area and a deeper cavity.

The wider base area provides more surface area contact between the package substrate 10 and the lid. The width of the base will depend upon the die and the package, but generally as much surface area between the base and the substrate as is possible without contacting any active components on the die 12 is desirable.

The deeper cavity prevents undue pressure upon the die during processing. As discussed above, some components use a low-k dielectric layer that may crack more easily than other materials. The cavity may need to be deep enough to avoid contact with the die while fastened into place with the restrainer lid.

It is possible that current IHS lids may be used as the restrainer lids, more than likely with the addition of a spring. A possible difference is that IHS lid will not be bonded to the surface of the substrate, as typically occurs when the component die is packaged. The IHS lid should be removable after a portion of the process during which its function as a stiffener has ended, such that other processes may be performed, such as thermal interface material dispense and cure. The absence of a sealant and the thermal interface material may provide enough of a gap between the lid and the die to prevent cracking of the die and its various layers. The base may be wide enough to provide sufficient surface area as described above, much depends upon the size of the die and the package.

Figure 5:
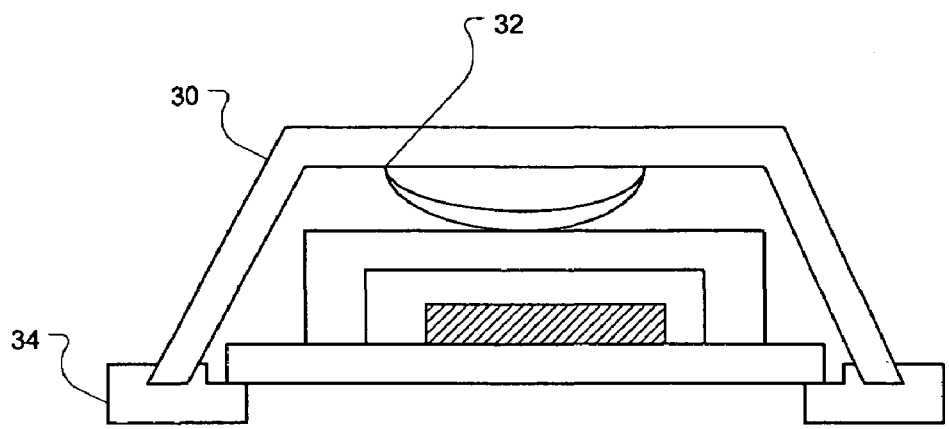
FIG. 5 shows an embodiment of a processing system for a component die package.

A packaging system is shown in FIG. 5. A clip 30 is used to attach the package to the carrier 34. In this example, a t-clip is used, but any sort of device that attaches the substrate and restrainer lid to the carrier may be used. All of these types of devices will be referred to here as clips.

A spring 32 on the underside of the clip 30 may prevent undue pressure on the restrainer lid that could cause pressure on the die. The spring allows for some adjustability, but is optional as the clip could be configured so as to ensure that there would not be any pressure on the lid that may cause pressure to be put on the die.

The attachment of this clip to the carrier and the substrate restrains the package during the high temperature processes that would otherwise cause it to warp convexly. It may have the effect of causing the package to warp concavely. The concavity then may be mitigated by further high temperature processing that would cause a counteractive convex warpage. However, it is possible that the restrainer lid and clip may keep the substrate planar without inducing any concavity. This may be enough to overcome subsequent convex warpage and the resulting substrate could be within the relevant specifications for coplanarity.

Figure 6:
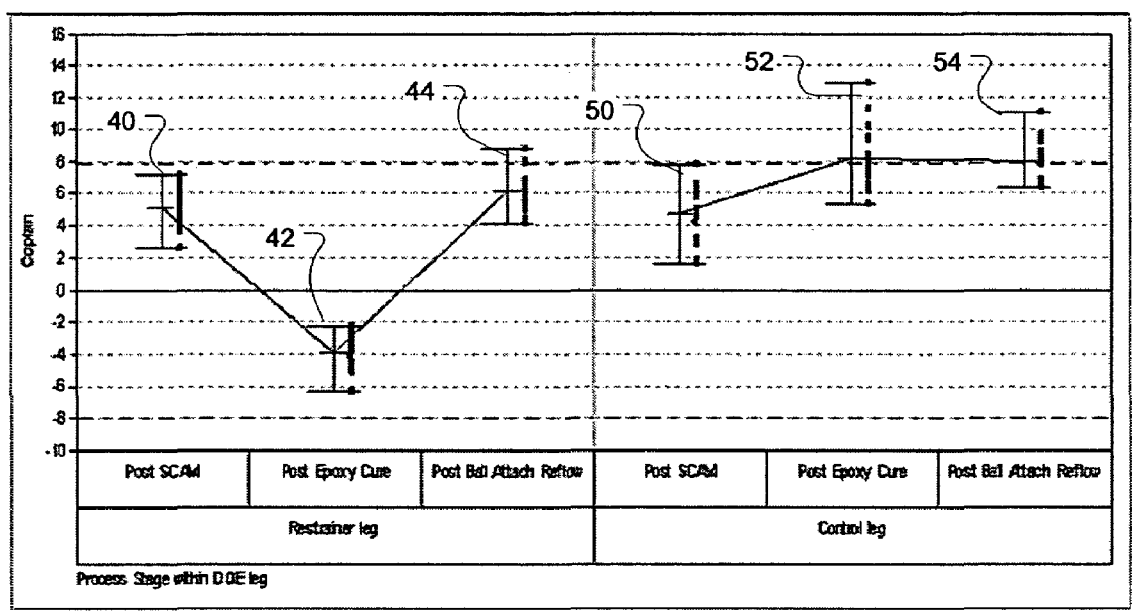
FIG. 6 shows a graph of coplanarity results for packages using a restrainer lid during processing.

FIG. 6 shows results of using the restrainer lid/clip system during processing. Coplanarity is shown on the y-axis and the various processes the package may undergo are shown on the x-axis. For experimental purposes, a restrainer process flow was performed, as was a control process flow. Positive values indicate a convex profile and negative values indicate a concave profile.

Moving from left to right, it can be seen that the package is convexly warped after the chip attach process at 40 for the restrainer flow and at 50 for the control flow. The post epoxy cure process resulted in a concave profile for the restrainer flow at 42. The convexity increased for the control flow at 52. After the ball attach reflow at 44, the restrainer leg has a coplanarity range of approximately 4 to 9 mils convex. The control flow has a coplanarity range of 6 to 11 mils convex at 54. As a result of the restrainer lid, more of the packages in the restrainer process flow will meet the JEDEC coplanarity standards of coplanarity of less than 8 mils.

In addition to modifying the process flow to include the packaging apparatus discussed above, it is possible to modify the packaging substrate and lid configuration to decrease coplanarity. An example of such a modification is shown in FIG. 7, which may be best understood as compared to FIG. 3.

Figure 7:
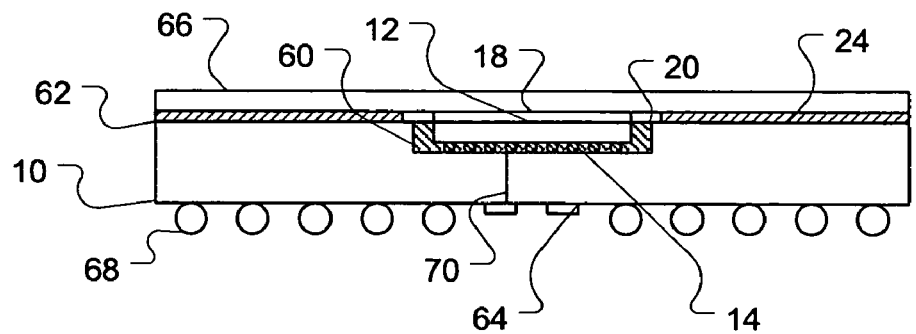
FIG. 7 shows an alternative embodiment of a package having a recessed portion of a substrate.

In FIG. 7, the substrate 10 has been modified to include a cavity or groove 60 on a first surface 62. The groove or cavity could be provided in several ways. For example, as the substrate is being built up, a portion of the outer layer may not be formed, such as by copper plating, etc. The formation of the groove is outside the scope of this disclosure.

The component die 12 is packaged such that the component die resides in the cavity. The die bumps or other connectors are provided as before, but are now located in the cavity. The underfill 20 and the die bumps 14 may also be used as before, but now used to fill the cavity 60, at least partially. The thermal interface material 18 lies between the component die 12 and the stiffener or lid 66. Sealant 24 lies between the portions of the substrate away from the cavity and the stiffener or lid 66.

The lid 66 is no longer a typical IHS lid as was shown in FIG. 3. The lid is now a flat or mostly flat piece that covers the entire package, separated by sealant and thermal interface material. This provides extra stiffness to the package and helps to mitigate the warpage induced in the further processing. As was discussed with regard to the restrainer lid, the more surface area contact possible between a restrainer and the substrate, the less warpage will generally occur. In this embodiment, the restrainer is a flat piece that is bonded to the substrate, rather than a temporary piece that is removed after processing.

While not shown in FIG. 3, there may be capacitors on the first surface of the substrate. These are generally referred to as die side capacitors. In this embodiment, with the die in a cavity, it may be desirable to move the die side capacitors to a second surface of the substrate 68, also referred to here as the underside of the substrate. These capacitors will be referred to as landside capacitors 64. The capacitors 64 may be connected to the die as needed by connectors, such as 70, on the underside of the substrate.

On the top, or first surface, of the substrate, it may be desirable that the component die be planar with the top surface of the substrate. This would be after mounting and underfill. This allows the thermal interface material and sealant to be dispensed in uniform layers and the flat lid 66 to be bonded uniformly across the surfaces of both the die and the substrate, contributing to the mechanical robustness of the package. It is possible that the die may lie below the plane of the substrate surface 62, or slight above, and planarity could be attained by management of the thickness of the thermal interface material and/or the sealant. These adjustments are possible during the packaging process. The resulting package is a planar package, meaning one that is mostly flat with low coplanarity as compared to any relevant standards.

Figure 8A:
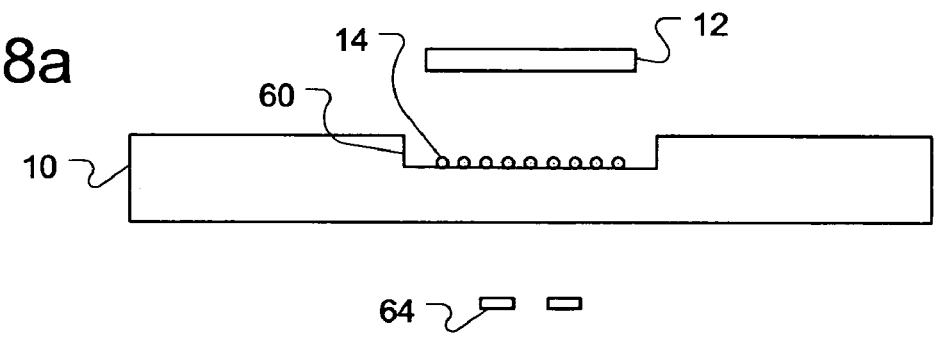
FIGS. 8a–8d show a package having a recessed portion of a substrate undergoing processing.
Figure 8B:
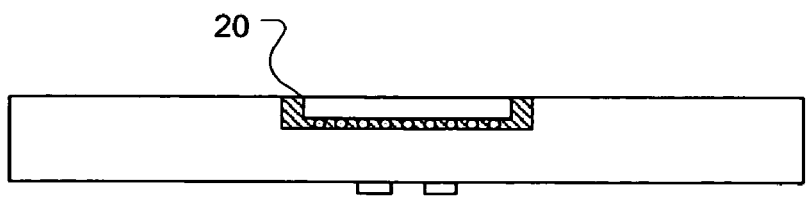
Figure 8C:
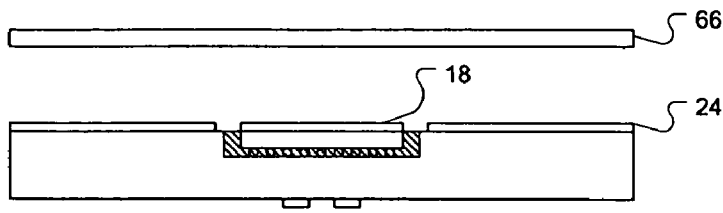
Figure 8D:
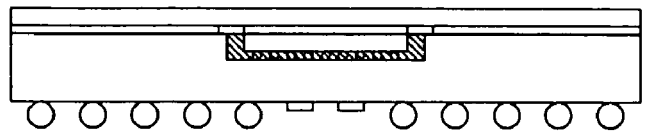

An embodiment of a process flow is shown in FIGS. 8a–8d. In 8a, the substrate 10 having the cavity 60 with connectors 14 is provided. The die 12 is then attached by the connectors to the substrate. Landside capacitors may also be attached at this point, connecting to die via connectors formed in the substrate. In 8b, the underfill material 20 is dispensed and cured. In 8c, the lid 66 is then attached to the first surface of the substrate 10. This may be accomplished by dispensing a sealant 24 on the substrate. Prior to the lid attach process, thermal interface material 18 may also be dispensed on the die. The resulting package is shown in FIG. 8d.

The addition of the flat stiffener lid may serve two purposes. Initially, it may straighten out any warpage induced by processes occurring prior to the attachment of the stiffener. Secondly, it may provide enough mechanical robustness to the package such that warpage is controlled in subsequent processes.

Another consideration in the use of the stiffener lid is the selection of the sealant used to attach it with regard to low coplanarity. In experiments conducted using the stiffener lid, an aluminum alloy lid was attached using Sumi G3 Epoxy and Dow 3-6265 sealant. Characterizations of the two sealant/lid combinations are shown in FIG. 9.

Figure 9:
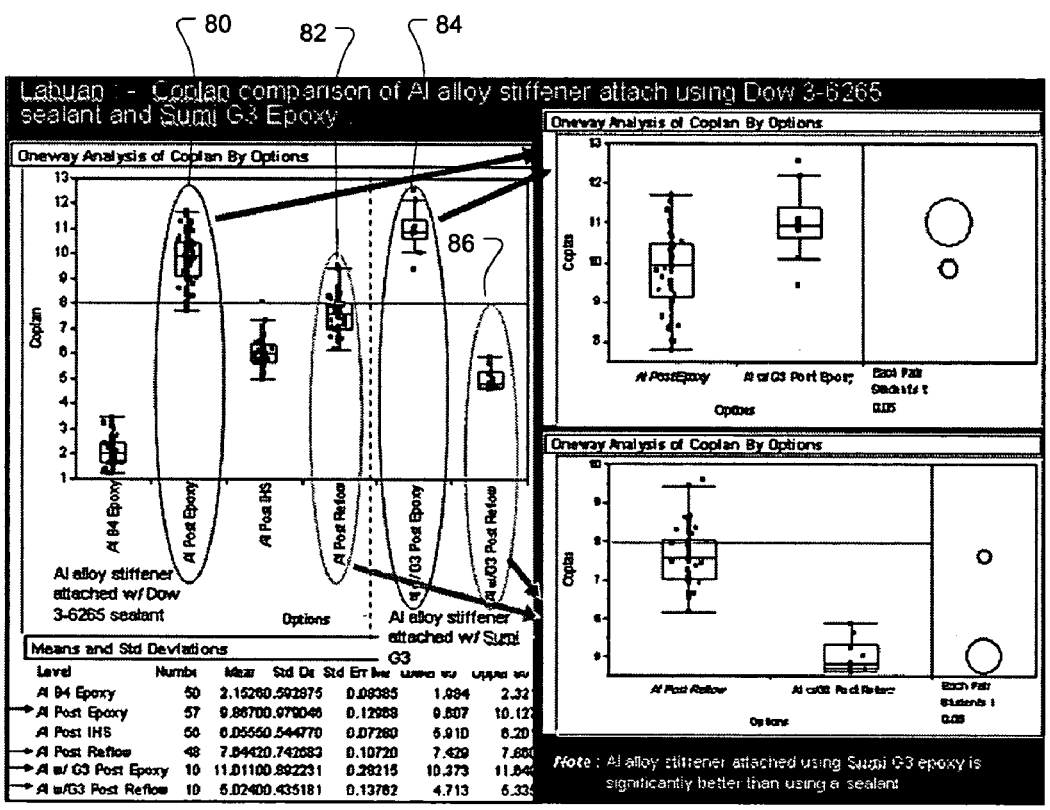
FIG. 9 shows a graph of coplanarity results for packages having a recessed portion of a substrate.

In FIG. 9, the far left side of the figure shows a side-by-side comparison of the two sealants. The coplanarity after the underfill epoxy cure for the Dow sealant is shown at 80, and after the ball reflow at 82. Most of the data points have coplanarity in the range of 6–9 mils.

On the right side of this graph, the coplanarity results for the Sumi G3 Epoxy is shown. The coplanarity after the underfill epoxy cure is shown at 84, and after the lid attach and ball reflow at 86. As can be seen here, the coplanarity is very much reduced when compared two the Dow sealant, having a range of 5–6 mils, all of which are compliant with the JEDEC specification. Expanded views of the coplanarity results at the post epoxy underfill point for each sealant are shown in the upper and lower portions of the far right of the figure.

In general, regardless of the sealant used, it can be seen that the use of the stiffener lid results in most of the packages being JEDEC compliant with regard to coplanarity. Similarly, the use of the restrainer lid during processing resulted in a majority of the packages being JEDEC compliant. In this manner, the warpage of the package is controlled and the efficiency and yield of the packaging lines are increased.

Thus, although there has been described to this point a particular embodiment for a method and apparatus for warpage control in packaging, it is not intended that such specific references be considered as limitations upon the scope of this invention except in-so-far as set forth in the following claims.

What is claimed is:

1. A method of packaging, the method comprising:
   placing an electronic component into a package;
   placing a restrainer on the package, where the restrainer has side walls to completely seal the electronic component from surrounding environment;
   clipping the restrainer and the package to a carrier;
   exposing the package to high temperatures; and
   removing the restrainer after a portion of a process such that the restrainer is not bonded to the package permanently.

2. The method of claim 1, the method further comprising:
   manufacturing the electronic component;
   dispensing an underfill material into the package.

3. The method of claim 2, exposing the package to high temperatures further comprising curing the underfill material.

4. The method of claim 3, curing the underfill material further comprising heating the underfill to cure it.

5. The method of claim 3, removing the restrainer further comprising removing the restrainer after the underfill is cured.

6. The method of claim 1, clipping the restrainer and the package further comprising clipping the restrainer with a t-clip.

7. The method of claim 1, removing the restrainer further comprising removing the restrainer before dispensing and curing of a thermal interface material between the restrainer and the electronic component.

* * * * *